(12) United States Patent
Van Banning et al.

(10) Patent No.: US 11,158,484 B2
(45) Date of Patent: Oct. 26, 2021

(54) ELECTRON BEAM INSPECTION TOOL AND METHOD OF CONTROLLING HEAT LOAD

(71) Applicant: ASML Netherlands B.V., Veldhoven (NL)

(72) Inventors: Dennis Herman Caspar Van Banning, Veldhoven (NL); Jeroen Gerard Gosen, Veldhoven (NL); Maarten Lambertus Henricus Ter Heerdt, Veldhoven (NL); Edwin Cornelis Kadijk, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/805,633

(22) Filed: Feb. 28, 2020

(65) Prior Publication Data
US 2020/0203117 A1    Jun. 25, 2020

Related U.S. Application Data

(63) Continuation of application No. PCT/EP2018/072939, filed on Aug. 25, 2018.

(30) Foreign Application Priority Data

Aug. 31, 2017   (EP) .................................... 17188682
Dec. 8, 2017    (EP) .................................... 17206118

(51) Int. Cl.
    *H01J 37/20*    (2006.01)

(52) U.S. Cl.
    CPC ....... *H01J 37/20* (2013.01); *H01J 2237/0264* (2013.01); *H01J 2237/0266* (2013.01);
    (Continued)

(58) Field of Classification Search
    CPC ............. H01J 37/20; H01J 2237/0264; H01J 2237/0266; H01J 2237/2001;
    (Continued)

(56) References Cited

U.S. PATENT DOCUMENTS 3,896,314 A   7/1975  Nukui et al.
6,252,705 B1  6/2001  Lo et al.
(Continued)

FOREIGN PATENT DOCUMENTS

EP   1 339 100 A1   8/2003
EP   2 573 794 A1   3/2013
(Continued)

OTHER PUBLICATIONS

International Search Report issued in related PCT International Application No. PCT/EP2018/072939; dated Nov. 16, 2018 (3 pgs).

*Primary Examiner* — Kiet T Nguyen
(74) *Attorney, Agent, or Firm* — Finnegan, Henderson, Farabow, Garrett & Dunner, LLP

(57) ABSTRACT

An e-beam inspection tool is disclosed, the tool comprising, an electron optics system configured to generate an electron beam, an object table configured to hold a specimen, a positioning device configured to position the object table, the positioning device comprising an actuator, wherein the positioning device further comprises a heating device configured to generate a heat load and a heat load controller to control the generated heat load at least partly based on an actuator heat load generated in the actuator.

20 Claims, 8 Drawing Sheets

(52) U.S. Cl.
CPC . *H01J 2237/2001* (2013.01); *H01J 2237/202* (2013.01); *H01J 2237/2002* (2013.01); *H01J 2237/2065* (2013.01); *H01J 2237/20271* (2013.01)

(58) Field of Classification Search
CPC ......... H01J 2237/202; H01J 2237/2002; H01J 2237/20271; H01J 2237/2065
USPC .................................. 250/443.1, 442.11, 310
See application file for complete search history.

(56) References Cited

U.S. PATENT DOCUMENTS

| | | |
|---|---|---|
| 2003/0042921 A1 | 3/2003 | Hollman |
| 2009/0224788 A1 | 9/2009 | Sasjima et al. |
| 2009/0250610 A1 | 10/2009 | Nara et al. |
| 2010/0195074 A1* | 8/2010 | Sogard .................... F24S 40/55 355/67 |
| 2012/0112068 A1 | 5/2012 | Maeda et al. |
| 2012/0145920 A1 | 6/2012 | Ogawa et al. |
| 2014/0226792 A1 | 8/2014 | Hansen et al. |
| 2016/0005568 A1 | 1/2016 | Mizuochi et al. |
| 2017/0011882 A1 | 1/2017 | Yen et al. |

FOREIGN PATENT DOCUMENTS

| | | |
|---|---|---|
| EP | 2 980 837 A1 | 2/2016 |
| JP | S 62160651 A | 7/1987 |
| JP | S 63117442 A | 5/1988 |
| JP | 2001 290543 A | 10/2001 |
| JP | 2004 111684 A | 4/2004 |
| JP | 2005 340719 A | 12/2005 |
| JP | 2006 074961 A | 3/2006 |
| JP | 2008 010259 A | 1/2008 |
| JP | 2009 252995 A | 10/2009 |
| JP | 2011 065956 A | 3/2011 |
| JP | 2018 041528 A | 3/2018 |
| TW | 446986 B | 7/2001 |
| WO | WO 2016 093185 A1 | 6/2016 |

* cited by examiner

ELECTRON BEAM INSPECTION TOOL AND METHOD OF CONTROLLING HEAT LOAD

CROSS-REFERENCE TO RELATED APPLICATIONS

This application claims priority to International Application No. PCT/EP2018/072939, filed Aug. 25, 2018, and published as WO 2019/042905 A1, which claims priority of EP application No. 17188682.3 filed on Aug. 31, 2017 and EP application No. 17206118.6 filed on Dec. 8, 2017. The contents of these applications are each incorporated herein by reference in their entireties.

FIELD

The disclosed embodiments relate to an electron beam (e-beam) inspection tool.

BACKGROUND

The disclosed embodiments relate to an e-beam inspection tool as can be applied to inspect semiconductor devices.

Defects are inevitably generated in the semiconductor process. Such defects may impact device performance even up to failure. Device yield may thus be impacted, resulting in cost raise. Current defects can be classified into systematic defects and random defects in general. In order to control semiconductor process yield, defect monitoring is important. One tool useful in defect monitoring is SEM (Scanning Electron Microscope).

During operation of an inspection tool, the substrate is typically held by an object table or substrate. The inspection tool will typically comprise a positioning device for positioning the object table, while the substrate is held by the object table, relative to the e-beam, in order to position a target area on the substrate, i.e. an area that needs to be inspected, in an operating range of the e-beam. Such a positioning device may e.g. comprise a plurality of actuators and motors for realizing the required positioning. During the operation of such actuators or motors, heat may be generated in the object table (and the substrate). Reliable inspection can typically only occur once the object table and substrate have reached a thermal equilibrium.

As such, in order to start a reliable inspection process, one may need to wait until the apparatus is in an operational thermal equilibrium. Reaching such an equilibrium, in particular when the apparatus has been out-of-service, may take a comparatively long time.

SUMMARY

It is an object of the disclosed embodiments to provide in an electron beam inspection tool in which an operational thermal equilibrium can be reached faster. It is a further objective of the disclosed embodiments to provide in an electron beam inspection tool that enables to maintain an operational thermal equilibrium.

According to a first aspect of the disclosure, there is provide an e-beam inspection tool comprising: an electron optics system configured to generate an electron beam; an object table configured to hold a specimen; a positioning device configured to position the object table, the positioning device comprising an actuator, wherein the positioning device further comprises a heating device configured to generate a heat load and a heat load controller to control the generated heat load at least partly based on an actuator heat load generated in the actuator.

According to an embodiment, the e-beam inspection tool further comprises: a first positioner configured to position the object table; and a second positioner configured to position the first positioner and the object table.

According to a second aspect of the disclosure, there is provided an e-beam inspection tool comprising: a vacuum chamber; an electron optics system arranged inside said vacuum chamber and configured to generate an electron beam; an object table arranged inside said vacuum chamber and configured to hold a specimen; a positioning device arranged inside said vacuum chamber and configured to position the object table;
wherein the vacuum chamber comprises an electromagnetic shield and wherein the electromagnetic shield comprises an absorptive coating.

BRIEF DESCRIPTION OF THE DRAWINGS

The present disclosure will be readily understood by the following detailed description in conjunction with the accompanying drawings, wherein like reference numerals designate like structural elements, and in which.

Figure 1:
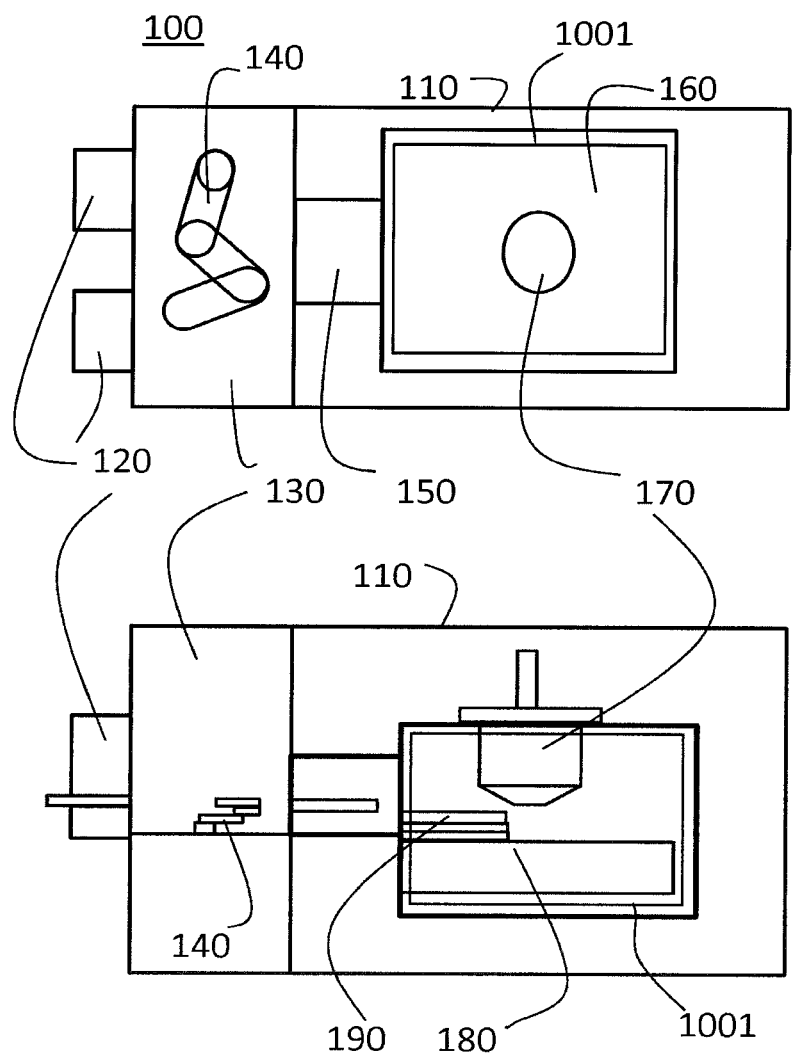
FIGS. 1A and 1B are schematic illustrations of an e-beam inspection tool according to an embodiment of the present disclosure.

While the disclosed embodiments are susceptible to various modifications and alternative forms, specific embodiments thereof are shown by way of example in the drawings and may herein be described in detail. The drawings may not be to scale. It should be understood, however, that the drawings and detailed description thereto are not intended to limit the disclosure to the particular form disclosed, but on the contrary, the intention is to cover all modifications, equivalents and alternatives falling within the spirit and scope of the disclosed embodiments as defined by the appended claims.

DETAILED DESCRIPTION

Various example embodiments will now be described more fully with reference to the accompanying drawings in which some example embodiments of the disclosure are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This disclosure may, however, may be embodied in many alternate forms and should not be construed as limited to only the embodiments set forth herein.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure. Like numbers refer to like elements throughout the description of the figures.

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

In this disclosure, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

The term, crossover, refers to a point where the electron beam is focused.

The term, virtual source, means the electron beam emitted from the cathode can be traced back to a "virtual" source.

The inspection tool according to the disclosed embodiments relates to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure.

FIGS. 1A and 1B schematically depict a top view and a cross-sectional view of an electron beam (e-beam) inspection (EBI) system 100 according to an embodiment of the present disclosure. The embodiment as shown comprises an enclosure 110, a pair of load ports 120 serving as an interface to receive objects to be examined and to output objects that have been examined. The embodiment as shown further comprises an object transfer system, referred as an EFEM, equipment front end module 130, that is configured to handle and/or transport the objects to and from the load ports. In the embodiment as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the embodiment as shown, the vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170. In an embodiment, the positioning device 180 is at least partly arranged within the vacuum chamber 160.

In an embodiment, the positioning device may comprise a cascaded arrangement of multiple positioners such an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances and a fine positioner, configured to provide a fine positioning of the object over comparatively small distances.

In an embodiment, the positioning device 180 further comprises an object table for holding the object during the inspection process performed by the EBI system 100. In such embodiment, the object 190 may be clamped onto the object table by means of a clamp such as an electrostatic clamp. Such a clamp may be integrated in the object table.

In accordance with the present disclosure, the positioning device 180 comprises a first positioner for positioning the object table and a second positioner for positioning the first positioner and the object table. In addition, the positioning device 180 as applied in the e-beam inspection tool 100 according to the present disclosure comprises a heating device that is configured to generate a heat load in the object table.

The positioning device 180 and heating device as applied in the present disclosure will be discussed in more detail below.

In an embodiment, the vacuum chamber 160 comprises an electromagnetic shield 1001 to shield of external electromagnetic influences. Such an electromagnetic shield 1001 may also be referred to as an EMI (electromagnetic interference) shield.

In an embodiment, the electromagnetic shield 1001 is configured to shield a detector of the inspection tool 100 from external influences.

Figure 2:
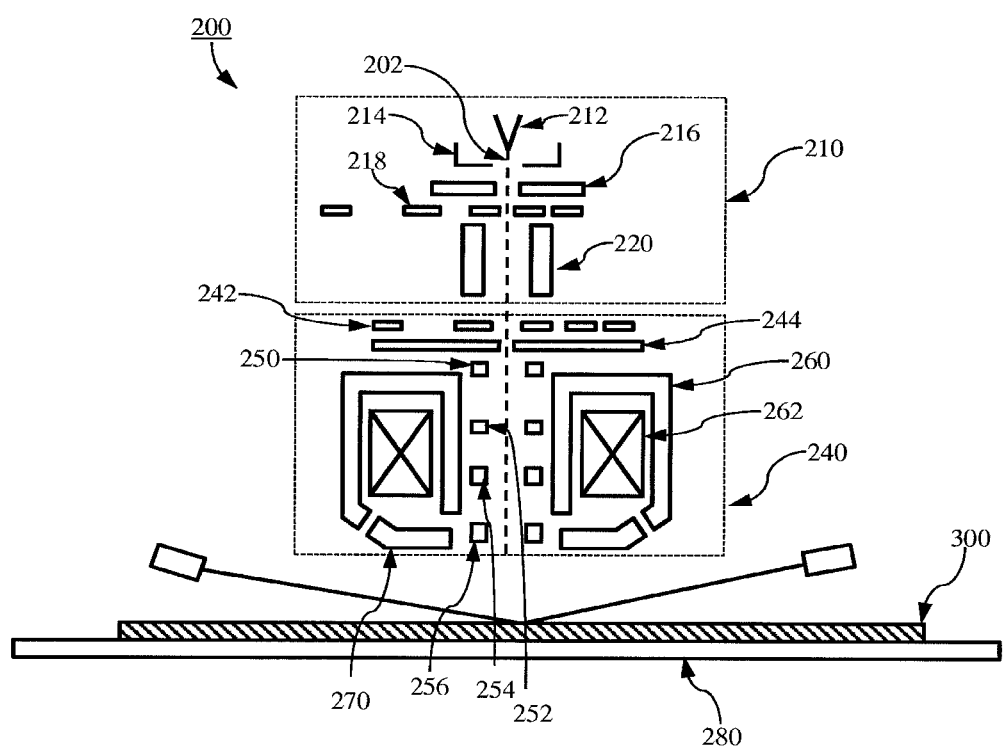
FIGS. 2 and 3 are schematic illustrations an electron optical system as can be applied in an embodiment of the present disclosure.

FIG. 2 schematically depict an embodiment of an electron optics system 200 as can be applied in e-beam inspection tool or system according to the present disclosure. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a $ZrO_2$ is coated on the surface of the tungsten pin, and is heated to 1300° C. so as to be melted and cover the tungsten pin but uncover the pinpoint of the tungsten pin. The melted $ZrO_2$ can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g. be an electrostatic lens which can condense the electron beam 202. On the other hand, the condenser 220 can be also a magnetic lens.

Figure 3:
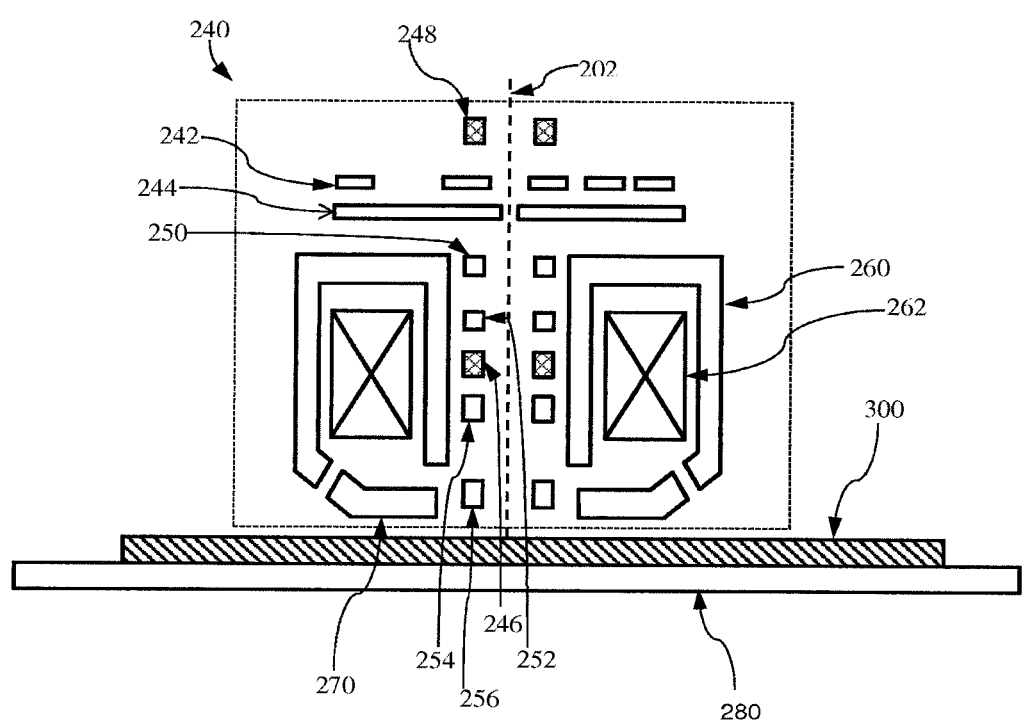

The imaging system 240 as shown in FIG. 3 comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 4:
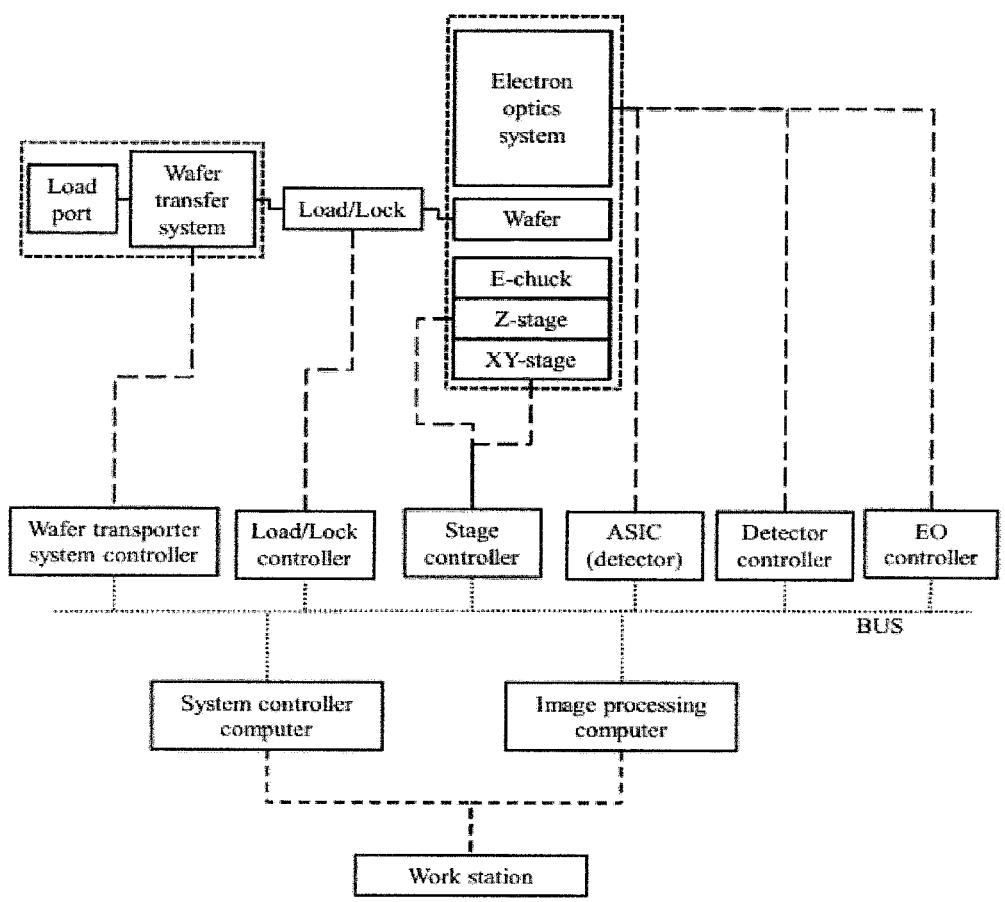
FIG. 4 schematically depicts a possible control architecture of an EBI system according to the present disclosure.

FIG. 4 schematically depicts a possible control architecture of an EBI system according to the present disclosure. As indicated in FIG. 1, the EBI system comprises a load lock, a wafer transfer system, a load/lock, an electron optics system and a positioning device, e.g. including a z-stage and a x-y stage. As illustrated, these various components of the EBI system may be equipped with respective controllers, i.e., a wafer transporter system controller connected to the wafer transfer system, a load/lock controller, an electron optics controller, a detector controller, a stage controller. These controllers may e.g. be communicatively connected to a system controller computer and an image processing computer, e.g. via a communication bus. In the embodiment as shown, the system controller computer and the image processing computer may be connected to a workstation.

The load port loads a wafer to the wafer transfer system, and the wafer transfer system controller controls the wafer transfer to transfer the wafer to the load/lock. The load/lock controller controls the load/lock to the chamber, such that an object that is to be examiner, e.g. a wafer can be fixed on a clamp, e.g. an electrostatic clamp, also referred to as an e-chuck. The positioning device, e.g. the z-stage and the xy-stage, enable the wafer to move by the stage controller. In an embodiment, a height of the z-stage may e.g. be adjusted using a piezo component such as a piezo actuator. The electron optic controller may control all the conditions of the electron optics system, and the detector controller may receive and convert the electric signals from the electron optic system to image signals. The system controller computer is to send the commands to the corresponding controller. After receiving the image signals, the image processing computer may process the image signals to identify defects.

Figure 5:
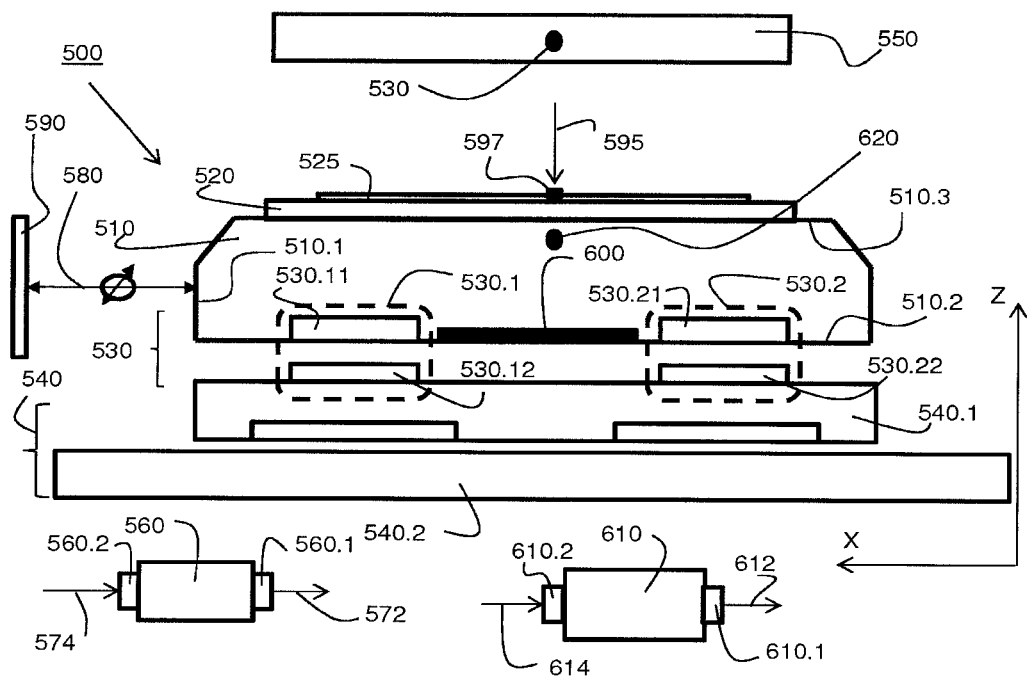
FIG. 5 schematically depicts a first embodiment of an e-beam inspection tool according to the present disclosure.

FIG. 5 schematically depicts a cross-sectional view of a first embodiment of a positioning device 500 that can be applied in an electron beam inspection tool according to the present disclosure. In the embodiment as shown, the positioning device 500 comprises an object table 510 onto which a clamp 520 is mounted. Such a clamp 520 may e.g. be an electrostatic clamp or the like, configured to hold a specimen 525, e.g. a semiconductor wafer or a reticle that needs to be inspected. In the embodiment as shown, the object table 510 serves as a target, in particular surface 510.1 of the object table 510, for a position measurement system 580. Such a position measurement system 580 may e.g. project a measurement beam on the object table 510, in particular on the surface 510.1 upon which the beam may e.g. reflect. In such case, the object table 510 may also be referred to as a mirror block. In an embodiment, the object table, or mirror block, may comprise a further support structure (not shown) for supporting the clamp 520. The object table 510 may e.g. be made from a material have a low thermal expansion coefficient such as ULE or Zerodur. In the embodiment as shown, the positioning device 500 comprises a first positioner 530 for positioning the object table 510. As schematically shown, the first positioner 530 comprises a plurality of actuators 530.1, 530.2, configured to exert a force on the object table 510. In an embodiment, the actuators may e.g. be electromagnetic actuators such as Lorentz actuators. Such actuators may e.g. comprise a magnet assembly 530.11, 530.21 configured to co-operate with a coil assembly 530.12, 530.22 for generating a force. Such actuators may also be referred to contactless actuators, since the magnet assembly and coil assembly that form such an actuator are typically spaced apart. In the embodiment as shown, the coil assemblies 530.12, 530.22 are mounted to a mover 540.1 of a second positioner 540, the second positioner 540 being configured to position the first positioner 530 and the object table 510. The second positioner 540 may e.g. comprise one or more linear or planar motors having a mover 540.1 that is configured to be displaced relative to a stator 540.2, e.g. in a horizontal direction or in a horizontal plane. In the embodiment as shown, the positioning device 500 can be considered a cascaded arrangement of a fine positioning device (the first positioner 530) and a coarse positioner (the second positioner 540) whereby the fine positioning device is configured to accurately position the object table 510 over a comparatively short stroke, e.g. only a few mm or less, while the coarse positioning device is configured to displace the fine positioning device 530 and the object table 510 holding the specimen 525 over a comparatively long stroke, e.g. 500 mm or more. In the embodiment as shown, the positioning device further comprises a controller 560 for controlling the first and second positioners 530, 540, thereby controlling a position of the specimen 525, e.g. relative to an e-beam. In the embodiment as shown, the controller 560, e.g. comprising a microprocessor, microcontroller, computer or the like, may be configured to generate one or more control signals 572, outputted via output terminal 560.1 of the controller 560. The controller 560 further comprises an input terminal 560.2 for receiving an input signal 574, e.g. a signal representative of a position of the object table 510. Such a signal 574 may e.g. be generated by a position measurement system 580, e.g. an encoder based or interferometer based position measurement system that is configured to measure a position of the object table 510 relative to a reference 590, e.g. a reference frame such as a metrology frame.

Using a plurality of the mentioned contactless actuators, e.g. a set of 3 or 4 actuators for generating a force in the vertical direction (indicated as the Z-direction) combined with a set of 3 or 4 or 6 actuators for generating a force in a horizontal plane, perpendicular to the Z-direction, would enable the object table to be levitated and positioned in 6 DOF (degrees of freedom) in a contactless manner, i.e. without there being any direct contact between the object table 510 and the mover 540.1. Such a contactless arrangement may be beneficial in that vibrations of second positioner 540, e.g. of the mover 540.1, will not or only partially be transmitted to the object table. This can e.g. be attributed to the low stiffness characteristic of the electromagnetic actuators.

Such a contactless arrangement may however have the following drawback: during operation, the object table 510 is subjected to various heat loads, resulting in a temperature rise of the object table. The following heat loads may be identified:

heat generated by the actuators;
heat generated by the clamping, e.g. electrostatic clamping dissipation;
heat generated by the e-beam impinging on the specimen; and
heat generated by radiation from hot surface in the vacuum chamber environment.

Typical values for the mentioned heat loads may e.g. be 0.3-0.7 W for the heat generated by the actuator and a few mW for the clamp heat and the e-beam heat.

Because the object table in an e-beam inspection tool is located in a vacuum chamber, there is no possibility to remove the heat via conduction or convection. Rather, the heat that is generated in the actuators, clamp and specimen needs to be removed by means of radiation. In order to realize this removal by means of radiation, the object table needs to be at an elevated temperature, compared to its environment, e.g. a wall or top of the vacuum chamber or vessel housing the positioning device and object table. In order to reach a thermal equilibrium, i.e. a state whereby the amount of heat generated equals the amount of heat emitted by means of radiation, a temperature difference of 1 to 2 Kelvin between the object table and the vacuum chamber or vessel may be required. In an embodiment, a wall or ceiling of the vacuum chamber may be used as a heatsink (schematically indicated by reference number 550) for the generated heat. In an embodiment, such a heat sink may be kept at a nominal temperature by means of a coolant such as water. As such, in order to arrive at this equilibrium, the temperature of the object table 510 may need to be elevated by 1 to 2 Kelvin when starting from a non-operative state of the tool. Because the heat loads that are generated in the object table are comparatively small, elevating the temperature of the object table by 1 to 2 Kelvin may take a long time. To elevate the temperature of an object table of e.g. 6 kg by 1 to 2 Kelvin by means of the aforementioned heat loads (actuators, clamp and e-beam), could typically require several hours.

During this period, it may be difficult to obtain accurate inspection results. This is due to the fact that, prior to the object table reaching its thermal equilibrium, the object table and the object will be subjected to a thermal deformation, i.e. the object table 510, the clamp 520 and the specimen 525 will deform, i.e. expand, during the heat up process. This thermal expansion will make it difficult to maintain the inspection beam (schematically indicated by arrow 595) onto the right position, i.e. a position where a particular feature 597 on the specimen can be examined. Note that the inspection of a particular feature on a specimen may require that the particular feature needs to be kept in the same position for several seconds or even longer. Due to the thermal expansion of the object table 510 however, the position measurement signal as generated by the position measurement system 580 will not remain constant and neither will the distance between the particular feature 597 that is examined and a reference plane 510.1 of the object table 510, e.g. a reference plane that may be used by an interferometer measurement system 580 to determine an X-position of the object table 510 relative to the reference 590. As a practical example, it may be an objective to perform an alignment of the sample only every 15 min. During this period, a drift of the position of the feature that is examined should e.g. be maintained below 5 nm, e.g. below 4 nm. If the objective is not met, an additional alignment may need to be performed, which would typically take about 1 min. Such an additional alignment would thus adversely affect the throughput of the tool.

So, as long as the object table 510 has not reached its thermal equilibrium, a proper inspection of the specimen may need to be postponed, thus adversely affecting the tool availability.

In order to mitigate this downtime, the present disclosure provides in the application of a heating device 600 that is configured to generate a heat load in the object table 510. By means of such a heating device 600, a heat load may be generated that exceed the nominal heat loads that are generated in the object table 510, i.e. the aforementioned actuator heat load, the clamp heat load and the e-beam heat load. By applying a heat load that exceeds the nominal heat load, e.g. applying a heat load that is 5 or 10 times the nominal heat load, the object table 510 can be brought to its thermal equilibrium much faster. By e.g. using a heating device that is capable of applying a heat load of e.g. 5 to 15 Watt, the time to reach a thermal equilibrium may typically be reduced from several hours to e.g. 10 to 15 min.

In the embodiment as shown, the heating device 600 is mounted to a bottom surface 510.2 of the object table 510.

In accordance with the present disclosure, various options exist to realize such a heating device.

In an embodiment, the heating device 600 comprises an electric heating device.

Such a heating device may e.g. comprise an electric heating wire that is mounted to the object table. Alternatively, the electric heating device may be an inductive, heating device. In such embodiment, the heating device may e.g. comprise an electrical conductor, e.g. a plate shaped electrical conductor made of Cu or Al, mounted to the bottom surface of the object table 510 and a coil, e.g. mounted to a top surface of the mover 540.1 and facing the electrical conductor. By applying an alternating current to the coil, Eddy currents will be induced in the electrical conductor mounted to the object table 510, thus providing a heat load to the object table 510.

In an embodiment, the heat load as generated and applied to the object table 510 may be controlled by a heat load controller 610. Such a controller 610 may e.g. control a current as applied to an electric heat wire of a heating device or a current as applied to a coil of an inductive heating device, thereby controlling the amount of heat as generated in the object table 510. In order to realize this, the heat load controller 610 may e.g. be configured to output a control signal 612, via an output terminal 610.1 of the controller 610, for controlling the current.

In an embodiment, the amount of heat as generated by the heating device 600 may also be based on a temperature measurement, in particular a temperature measurement of the object table 510. In the embodiment as shown, the object table 510 is provided with a temperature sensor 620, e.g. mounted at a central location of the object table, e.g. on or in a top surface 510.3 of the object table. In such embodiment, a signal 614 representative of the temperature that is measured by the sensor 620 may be provided to an input terminal 610.2 of the controller 610. In such embodiment, the heat load controller 610 may be configured to control the generated heat load in feedback manner, i.e. the heat load generated by the heating device 600 in the object table 510, so as to reach a predetermined temperature difference between the object table 510 and the heatsink 550. In order to facilitate this, the heatsink 550 may also be provide, in an embodiment, with a temperature sensor for providing a signal representative of the temperature of the heatsink 550. Such a signal may also be provided to the heat load controller 610 to control the generated heat load in feedback manner.

In an embodiment, the temperature sensor 620 may be mounted on an actuator or in thermal contact with the actuator. In such embodiment, the signal 614 is representative of a temperature of the actuator. In such embodiment, the heat load controller 610 may be configured to control the generated heat load in feedback manner to compensate for a change of the temperature of the actuator.

In an embodiment, the amount of heat as generated by the heating device 600 may be based on a trajectory information of the positioning device 500 such as past, current, and future positions of the positioning device during an operation cycle, and/or an actuation profile of the positioning device 500 such as the acceleration, the velocity, and the standstill time where the object table 510 is standstill. In such an embodiment, the heat load controller 610 may be configured to control the generated heat load in a feed-forward manner based on the trajectory information and/or the actuation profile such that the generated heat load is adjusted with respect to the varying actuator heat load during the operation cycle.

In an embodiment, the heat load controller 610 may be configured to control the generated heat load by a combination of the feed-forward control based on the trajectory information and/or the actuation profile, and the feed-back control based on the temperature measurement.

In an embodiment, the heat load controller 610 may comprises a thermal model configured to determine a temperature of the object table based on the actuator heat load and/or the temperature measurement. The thermal model may be calibrated and/or updated using the temperature measurement. In such embodiment, the heat load controller 610 may be configured to control the generated heat load based on the determined temperature of the object table by the thermal model.

In an embodiment, the heating device 600 may comprise a plurality of heating devices or heaters that are distributed across the object table.

In an embodiment, such a plurality of heating devices may be located at or near the applied actuators of the first positioner 530. In such embodiment, the heating devices may e.g. be applied at interfaces between the actuators and the object table, e.g. between magnet assemblies of the actuators and the object table.

Figure 6:
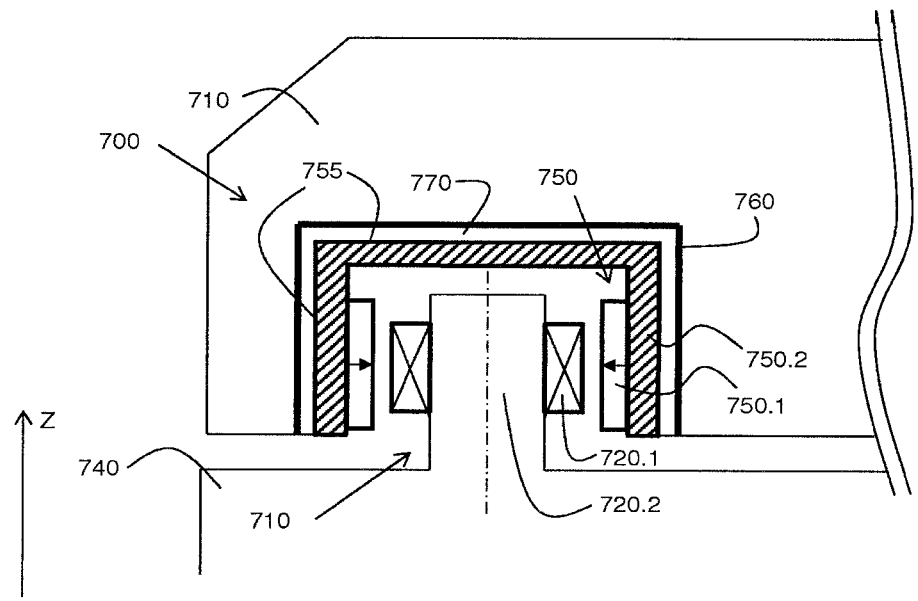
FIG. 6 schematically depicts a Z-actuator as can be applied in an e-beam inspection tool according to the present disclosure.
Figure 7:
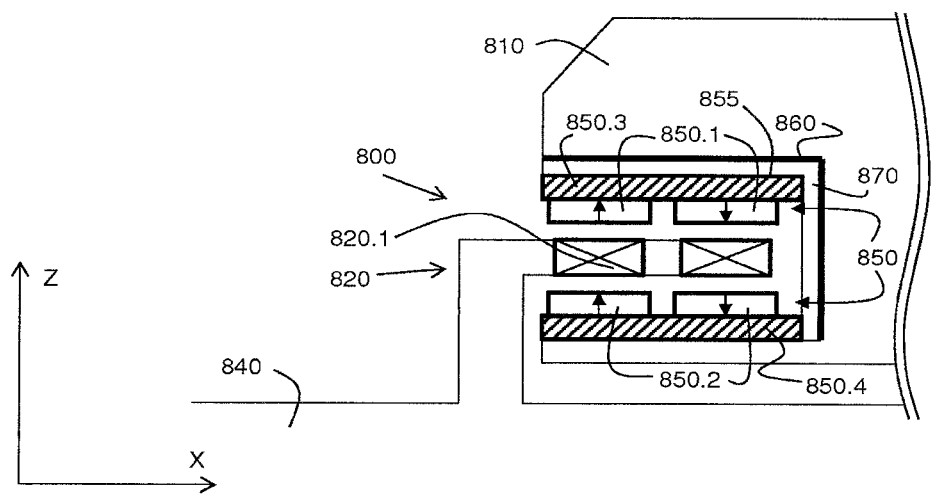
FIG. 7 schematically depicts an X- or Y-actuator as can be applied in an e-beam inspection tool according to the present disclosure.

FIGS. 6 and 7 schematically depicts such arrangements for two different electromagnetic actuators.

FIG. 6 schematically shows a cross-sectional view of an electromagnetic actuator 700 that can be applied to exert a vertical force, i.e. along the Z-direction, onto an object table 710. The actuator 700 as shown has an axis symmetrical design; such actuators are generally known and may also be referred to as voice coil actuators. In the embodiment as shown, the actuator 700 comprises a coil assembly comprising a coil 720.1 that is mounted to or wound about a core 720.2, e.g. a ferromagnetic core. This core 720.2 may e.g. be mounted to or be part of a mover 740 of a long stroke positioner such as the second positioner 540 shown in FIG. 5. The actuator 700 further comprises a magnet assembly 750 comprising a radially magnetized permanent magnet 750.1 mounted to a ferromagnetic core 750.2. The magnet assembly and coil assembly are constructed and arranged in such manner that when a current is supplied to the coil 720.1 of the coil assembly 720, a force is generated along the vertical direction, i.e. the Z-direction.

In the embodiment, as shown, an electromagnetic shielding 760 is applied to shield or contain the magnetic field generated by the actuator 700. Such a shielding is preferable applied in an e-beam inspection tool in order to avoid any disturbance between the magnetic field of the actuator 700 and the e-beam that is applied to inspect the specimen. As an example of such a shielding the application of a sheet or layer of mu-metal can be mentioned. Such a layer may e.g. have a thickness in a range between 0.5 and 2 mm, e.g. 1 mm. In the embodiment as shown, a heating device 770 is applied to an outer surface 755 of the magnet assembly 750.2 of the actuator 700. Such a heating device 770 may e.g. comprise an electric heating wire in which a heat load may be generated that is distributed across the object table 710. The heating device 770 may be controlled in a similar manner as discussed above, e.g. by a heat load controller, whereby the heat load controller may e.g. control the heat load that is generated based on a feedback signal received from one or more temperature sensors, e.g. temperature sensors mounted in the object table or in a heatsink of the e-beam inspection tool.

FIG. 7 schematically shows a cross-sectional view of an electromagnetic actuator 800 that can be applied to exert a horizontal force, e.g. along the indicated X-direction, onto an object table 810. The actuator 800 as shown comprises a coil assembly 820 comprising a coil 820.1 that is mounted to a mover 840 of a long stroke positioner such as the second positioner 540 shown in FIG. 5. The actuator 800 further comprises a magnet assembly 850 comprising two pairs of permanent magnets 850.1, 850.2 mounted to ferromagnetic members 850.3 and 850.4. The magnet assembly and coil assembly are constructed and arranged in such manner that when a current is supplied to the coil 820.1 of the coil assembly 820, a force is generated along the horizontal direction, i.e. the X-direction.

In the embodiment, as shown, an electromagnetic shielding 860 is applied to shield or contain the magnetic field generated by the actuator 800. Such a shielding is preferable applied in an e-beam inspection tool in order to avoid any disturbance between the magnetic field of the actuator 800 and the e-beam that is applied to inspect the specimen. As an example of such a shielding the application of a sheet or layer of mu-metal can be mentioned. Such a layer may e.g. have a thickness in a range between 0.5 and 2 mm, e.g. 1 mm. In the embodiment as shown, a heating device 870 is applied that partially encloses or surrounds the magnet assembly 850. As can be seen, part of the heating device 870 is mounted to an outer surface 855 of the magnet assembly 850 of the actuator 800. Such a heating device 870 may e.g. comprise an electric heating wire in which a heat load may be generated that is distributed across the object table 810. The heating device 870 may be controlled in a similar manner as discussed above, e.g. by a heat load controller, whereby the heat load controller may e.g. control the heat load that is generated based on a feedback signal received from one or more temperature sensors, e.g. temperature sensors mounted in the object table or in a heatsink of the e-beam inspection tool.

In an embodiment of the present disclosure, the first positioner of the positioning device of the e-beam inspection tool according to the present disclosure comprises a plurality of voice-coil actuators 700 for positioning the object table in the vertical direction and a plurality of actuators 800 for positioning the object table in the horizontal plane. In an embodiment, each of these actuators may be provided with a heating device such as heating devices 770 and 870. Such an embodiment may e.g. be applied to rapidly bring the object table from a 'cold state', prior to startup, to a thermal equilibrium as would occur when the tool is operating under nominal conditions. As also illustrated above, by applying a heat load that exceed the nominal heat load of the actuators, clamp and e-beam to the object table, the nominal operational thermal equilibrium may be reached faster, compared to the situation where no heat load is applied.

The embodiment of the e-beam inspection tool whereby the heating device comprises a plurality of heating devices that are distributed across the object table, e.g. each heating device being associated with an actuator as shown in FIGS. 6 and 7, may also be used in the following operating mode:

Rather than merely ensuring that the e-beam inspection tool according to the present disclosure reaches a nominal operating temperature at an accelerated pace, the embodiment of the e-beam inspection tool that uses a plurality of distributed heating devices may be used to compensate for any unbalance in the heat load that may occur over time.

During the processing of an entire substrate, during which process a plurality of area's of interest on the substrate, in general the object, need to be inspected, the heat load generated by the individual actuators may vary. In case such a variation occurs, this may affect the thermal equilibrium of the object table, in particular, due such a shift in heat load, the temperature distribution across and in the object table will shift or change as well, resulting in a thermal deformation of the object table. In order to avoid or mitigate this effect, the heating devices as applied in the e-beam inspection tool according to the present disclosure may be used to ensure that the heat load, in particular the heat load distribution across the object table can be kept substantially constant during the execution of an inspection process of a substrate or object in general. In general, the heat load as generated by the plurality of actuators as a function of time during an operating cycle, i.e. a cycle during which one or more substrates are inspected may be determined, estimated or simulated in advance. Once this heat load distribution over time is determined for each of the actuators, one may easily determine the required heat load to be generated by the heating devices such that the combined heat load of an actuator and an associated heating device, e.g. a heating device that is mounted on or near the actuator, is substantially constant. In an embodiment, a required heat load of a heating device $HL_{hd}(t)$ associated with a particular actuator may be determined as:

$$HL_{hd}(t)=HL_{amax}-HL_a(t) \quad (1)$$

Wherein:
$HL_{hd}(t)$=the required heat load to be generated by the heating device associated with an actuator;
$HL_{amax}$=the maximum heat load of the actuator during the operating cycle;
$HL_a(t)$=the actual heat load of the actuator during the operating cycle, i.e. the actual heat load as a function of time t.
By selecting the heat load of the heating device associated with an actuator, the combined heat load of the heating device and the actuator during an operating cycle will remain substantially constant, i.e. equal to $HL_{amax}$.

As such, in an embodiment of the present disclosure, whereby each of the plurality of actuators of the first positioner comprises a heating device or can be associated with a heating device, a thermal equilibrium can be maintained during an operating cycle by including a heat load controller to the e-beam inspection tool for controlling a heat load distribution of the plurality of heating devices, whereby the heat load controller is configured to control a heat load distribution of the plurality of heating devices such that a combined heat load of an actuator of the plurality of actuators and a heating device of the actuator remains substantially constant during an operating cycle of the e-beam inspection tool.

Such a combined heat load will obviously result in more elevated temperature of the object table. However, is should be pointed out that, in contrast to the operation of a lithographic projection apparatus, the object table, and object, in an e-beam inspection tool need not be kept at a predetermined constant temperature. In order to accurately match a pattern in a patterned radiation beam with a previously applied pattern, the temperature of the object, i.e. the substrate, needs to be accurately kept at a constant temperature. In order to realize this, a large cooling effect is applied to cool the object table onto which the substrate is mounted.

The inventors of the present disclosure have realized that, for an e-beam inspection tool, it is not required to keep the object at a predetermined temperature; it is sufficient to ensure that the temperature distribution of the object table remains sufficiently constant during the inspection process.

As such, compared to conventional object tables as applied in lithographical apparatuses, the object table as provided in the e-beam inspection tool according to the present disclosure need not be cooled. As such, in an embodiment, the object table as applied in the e-beam inspection tool according to the present disclosure may be characterized by not having a cooling device, e.g. a cooling device configured to cool the object table using a fluid coolant. It can further be noted that the absence of such a cooling device may provide an important advantage for an e-beam inspection tool. This is due to the fact that in such a tool, the object needs to be kept at a comparatively high voltage, e.g. in a range between 10 kV and 40 kV, e.g. 15 kV up to 30 kV. The combination of such a high voltage and the application of a coolant would require additional measures with respect to electrical insulation of the object table that are not needed in the inspection tool according to the present disclosure.

Figure 8:
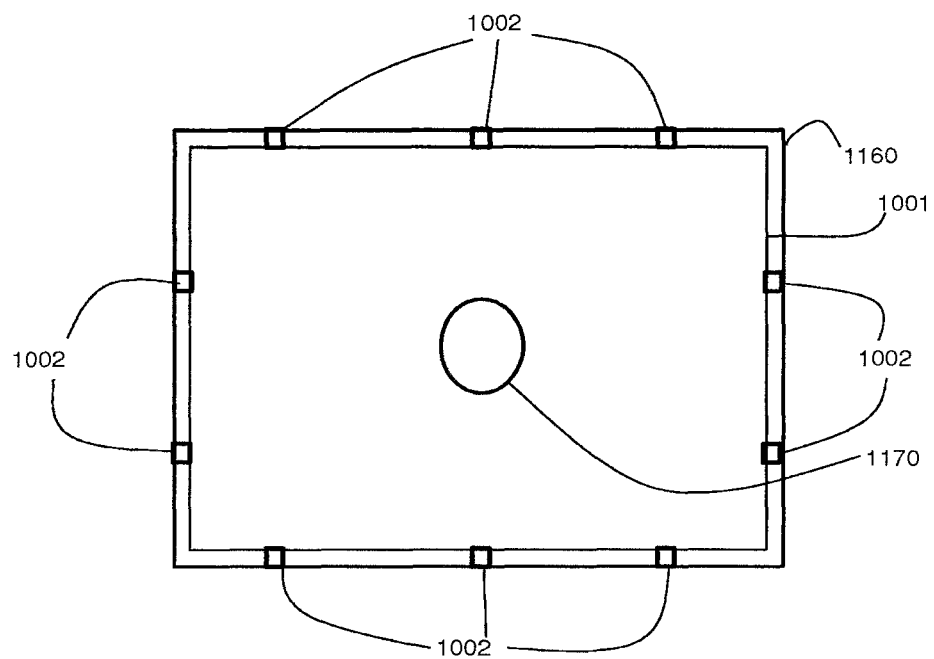
FIG. 8 schematically depicts a top view of a vacuum chamber of an e-beam inspection tool according to the present disclosure.

FIG. 8 shows a top view of a vacuum chamber 1160 of an e-beam inspection tool with an electron optics system 1170 arranged therein. The electron optics system 1170 is configured to generate an electron beam. The e-beam inspection tool further comprises an object table arranged inside said vacuum chamber and configured to hold a specimen. The e-beam inspection tool also comprises a positioning device arranged inside said vacuum chamber and configured to position the object table. The object table and positioning device may be in accordance with FIG. 1A-1B.

The vacuum chamber 1160 comprises an electromagnetic shield 1001 which in the shown embodiment is connected to the wall of the vacuum chamber 1160 by bolts 1002 which are schematically shown in FIG. 8. The electromagnetic shield 1001 reduces the electromagnetic radiation inside the vacuum chamber 1160, which could interfere with the electron beam of the electron optics system 1170 and which could thus reduce the quality of the inspection. By shielding electromagnetic radiation emitted by sources external to the vacuum chamber, the electromagnetic shield 1001 prevents that such electromagnetic radiation enters the vacuum chamber 1160. In an embodiment, the electromagnetic shield 1001 may comprises a magnetic alloy with high permeability, e.g. mu-metal. The electromagnetic shield 1001 may have a thickness of less than 1 mm. e.g. 0.360 mm. It should be noted that although in the shown example the electromagnetic shield 1001 is depicted as a separate entity within the vacuum chamber 1160, in an embodiment the electromagnetic shield 1001 can also be incorporated in the wall of the vacuum chamber 1160. It should further be noted that in an embodiment the distance between the electromagnetic shield 1001 and the wall of the vacuum chamber 1160 is substantially smaller than schematically shown in FIG. 8.

As is explained above, because the object table in an e-beam inspection tool is located in a vacuum chamber, it is difficult to remove the heat to the electromagnetic shield 1001 via conduction or convection. Rather, the generated heat should therefore be removed by means of radiation towards the vacuum chamber where it should be absorbed and removed via conduction. A typical electromagnetic shield 1001 however will have a radiation emissivity that is relatively low. The radiation emissivity of a material represents its effectiveness in emitting energy as thermal radiation. For example, mu-metal has a radiation emissivity of about 0.15 and can generally be classified as a reflective material. The conventional electromagnetic shield 1001 would therefore slows down the removal of heat.

The second aspect of the disclosure provides for an improvement in the removal of thermal energy or heat from a vacuum chamber. According to the second aspect of the disclosure, the electromagnetic shield 1001 as applied in the e-beam inspection tool according to the present disclosure comprises an absorptive coating. By providing the electromagnetic shield 1001 with the absorptive coating the radiation emissivity of the electromagnetic shield 1001 is increased, meaning that the electromagnetic shield 1001 will absorb more thermal energy from the components in the vacuum chamber 1160 instead of reflecting said thermal energy back into the vacuum chamber 1160. The thermal energy absorbed by the electromagnetic shield 1001 may then be removed from the vacuum chamber 1160, e.g. via the walls of the vacuum chamber 1160.

The second aspect of the disclosure thus provides in an improved heat transfer of the components in the vacuum chamber 1160 and thereby decreases the stabilization time of the system. The decrease in stabilization time allows for a higher throughput in the system. Furthermore, the thermal stability of the object table is improved by the second aspect of the disclosure, which is advantageous as it results in a higher accuracy, e.g. for the positioning of the object table. Additionally it can be mentioned that in conventional systems wherein the electromagnetic shield 1001 is not provided with the absorptive coating, the thermal energy that a certain component within the vacuum chamber 1160 emits by thermal radiation is reflected by the electromagnetic shield 1001 towards other components. As a result thereof, components that are warmer or heat up more than other components can cause said other components to heat up by the reflected thermal radiation. This may result in thermal drift. For example, actuators or cables associated with a fine positioning device adapted to cause movement of the object table over short stroke may be heated up by actuators or cables associated with a coarse positioning device adapted to cause movement of the object table and the fine positioning device over a long stroke, since the long stroke movement results in more heat generation. The electromagnetic shield 1001 comprising the absorptive coating according to the second aspect of the present disclosure reduce this drawback, as less of the thermal radiation is reflected back into the vacuum chamber 1160. It will be appreciated by the skilled person that the second aspect of the disclosure can be applied separately of or in combination with the first aspect of the disclosure.

In an embodiment, the absorptive coating is provided only on the inside surface of the electromagnetic shield. Thus, in FIG. 8 this is the surface facing the inside of the vacuum chamber 1160. As such, the electromagnetic shield 1001 absorbs the thermal radiation emitted by the electron optics system, the object table or the positioning device, while reflecting thermal radiation from components outside of the electromagnetic shield 1001, e.g. the wall of the vacuum chamber 1160 in FIG. 8.

In an embodiment, the absorptive coating comprises silicon nitride. The inventors have found that applying silicon nitride on the electromagnetic shield 1001 can increase the radiation emissivity of the electromagnetic shield to 0.85 or higher.

In an embodiment, the absorptive coating comprises titanium nitride or niobium nitride.

In an embodiment, the absorptive coating, e.g. silicon nitride, that is applied on the electromagnetic shield 1001 has a crystalline structure. In this structure the radiation emissivity is higher than for example in an amorphous structure.

In the embodiment shown in FIG. 8, the electromagnetic shield 1001 transfers the absorbed thermal energy to the walls of the vacuum chamber 1160. Said transfer is accomplished by thermal radiation in the parts where the electromagnetic shield 1001 and the vacuum chamber 1160 are spaced apart from each other. The bolts 1002 provide conduction paths to remove energy from the electromagnetic shield 1001 via thermal conduction. Furthermore, in practice the electromagnetic shield 1001 may be closer to the wall of the vacuum chamber 1160 than is depicted in the schematic, drawing of FIG. 8. In an embodiment, the electromagnetic shield 1001 is configured to contact the wall of the vacuum chamber 1160, resulting in an improved thermal conduction.

Figure 9A:
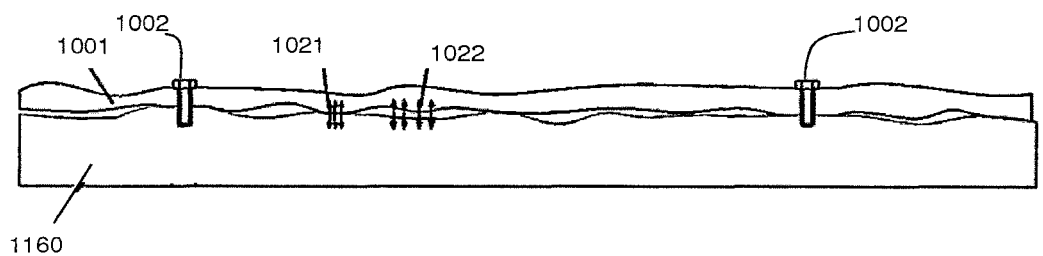
FIGS. 9a and 9b schematically depicts cross-sectional views of an electromagnetic shield and a vacuum chamber wall of an e-beam inspection tool according to the present disclosure.

FIG. 9a shows a more detailed cross-sectional view of the electromagnetic shield 1001 and the wall of the vacuum chamber 1160 in an embodiment of the disclosure. Bolts 1002 attach the electromagnetic shield 1001 to the inside surface of the wall of the vacuum chamber 1160. However, other suitable methods of connection can be used as well, such as other means for detachable mechanical connection or adhesives. In the shown embodiment, thermal energy or heat can be transferred from the electromagnetic shield 1001 to the wall of the vacuum chamber 1160 by manner of thermal conduction via the bolts 1002. In between two bolts 1002, the electromagnetic shield 1001 is not completely in contact with the wall of the vacuum chamber 1160, e.g. due to the roughness of the electromagnetic shield 1001 and/or the wall of the vacuum chamber 1160. Where the electromagnetic shield 1001 and the wall of the vacuum chamber 1160 are in contact with each other, thermal energy is also transferred by thermal conduction. This is for example illustrated by double sided arrows 1021 in FIG. 9a. However, on other parts the electromagnetic shield 1001 and the wall of the vacuum chamber 1160 are not in contact with each other. Consequently, on these parts the thermal energy is transferred by thermal radiation, which is for example illustrated by double sided arrows 1022 in FIG. 9a. In general, thermal conduction is more effective than thermal radiation for the transfer of thermal energy.

Figure 9B:
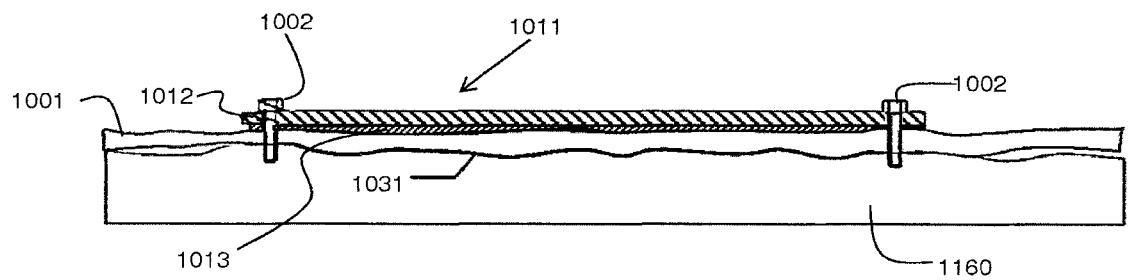

FIG. 9b shows a further embodiment of an electromagnetic shield as can be applied in an e-beam inspection tool according to the second aspect of the present disclosure, whereby a clamp 1011 is used to clamp the electromagnetic shield to the wall of the vacuum chamber. The clamp 1011 presses the electromagnetic shield 1001 against the wall of the vacuum chamber 1160. In the shown embodiment, the clamp 1011 is mounted to the electromagnetic shield 1001 and the wall of the vacuum chamber 1160 by bolts 1002 which attach the electromagnetic shield 1001 to the wall of the vacuum chamber 1160. However, other suitable methods for attaching the clamp 1011 could be used. In the zone clamped by the clamp 1011, which in FIG. 9b is below the clamp and indicated by reference numeral 1031, the electromagnetic shield 1001 is substantially completely in contact with the wall of the vacuum chamber 1160. The surface of thermal conduction is thus increased, which is beneficial for the transfer of thermal energy.

The clamp 1011 comprises a clamp part 1012. The clamp part 1012 may be an essentially rigid component, for example made from a metal. Preferably, the clamp part 1012 is made from a material which easily conducts the thermal energy. Optionally, the clamp part 1012 is provided with an absorptive coating, for example the same absorptive coating as the electromagnetic shield 1001 is provided with.

In the shown embodiment, the clamp 1011 further comprises an optional compressible part 1013. The compressible part 1013 may comprise a compressible material, for example a synthetic rubber or an elastomer such as a fluoropolymer elastomer. The clamp 1011 is arranged adjacent to the electromagnetic shield 1001 and mounted tightly against the wall of the vacuum chamber 1160. The shape of the compressible part 1013 is adaptable by the used mounting force, which adaptation is dependent on the surface of the electromagnetic shield 1001 and the wall of the vacuum chamber 1160 in the zone clamped by the clamp 1011. The compressible part 1013 presses the electromagnetic shield 1001 further against the wall of the vacuum chamber 1160, in particular on the locations where the electromagnetic shield and/or the wall of the vacuum chamber 1160 are uneven, for example due to the roughness of the used materials. The surface of thermal conduction is thus increased, as is the transfer of thermal energy.

In an embodiment, the clamp 1011, which in FIG. 9b is shown from a side view, has a rectangular shape when seen from a front view. Said rectangular shape may for example have dimensions of approximately 250 mm×50 mm. However, it is envisaged that the clamp 1011 can have another shape when suitable, for example circular, elongated or triangular.

In an embodiment, the absorptive coating is provided on a surface of the electromagnetic shield 1001 that faces the electron optics system, the object table or the positioning device. In an embodiment, one or more clamps are provided on a surface of the electromagnetic shield 1001 that faces the electron optics system, the object table or the positioning device. As such, the absorptive coating and/or one or more clamps 1011 are arranged on locations which are exposed to most thermal radiation from components inside the vacuum chamber 1160. Furthermore, one or more clamps 1011 can be arranged in the vicinity of heat loads, or facing said heat loads. As explained above, during operation, the object table is subjected to various heat loads, resulting in a temperature rise of the object table. The following heat loads may be identified:

heat generated by the actuators;
heat generated by electric cables;
heat generated by the clamping, e.g. electrostatic clamping dissipation;
heat generated by the e-beam impinging on the specimen; and
heat generated by radiation from a hot surface in the vacuum chamber environment.

Further embodiments may be described in the following clauses:

1. An e-beam inspection tool comprising:
    an electron optics system configured to generate an electron beam;
    an object table configured to hold a specimen;
    a positioning device configured to position the object table, the positioning device comprising an actuator,
    wherein the positioning device further comprises a heating device configured to generate a heat load and a heat load controller to control the generated heat load at least partly based on an actuator heat load generated in the actuator.
2. The e-beam inspection tool according to clause 1, wherein the heating device is mounted to the object table.
3. The e-beam inspection tool according to clause 1 or 2, wherein the positioning device comprises:

a first positioner configured to position the object table; and a second positioner configured to position the first positioner and the object table.

4. The e-beam inspection tool according to clause 3, wherein the actuator heat load comprises an actuator heat load by the first positioner.

5. The e-beam inspection tool according to clause 3 or 4, wherein the first positioner is a short-stroke positioner and the second positioner is a long-stroke positioner.

6. The e-beam inspection tool according to any of the preceding clauses, wherein the heat load controller is configured to control the generated heat load such that a combined heat load of the generated heat load and the actuator heat load remains substantially constant during an operating cycle of the e-beam inspection tool.

7. The e-beam inspection tool according to any of the preceding clauses, wherein the positioning device comprises a temperature sensor configured to output a temperature signal and the heat load controller is configured to control the generated heat load at least partly based on the temperature signal.

8. The e-beam inspection tool according to clause 7, wherein the temperature signal is representative of a temperature of the positioning device.

9. The e-beam inspection tool according to clause 7, wherein the temperature signal is representative of a temperature of the actuator.

10. The e-beam inspection tool according to any of clauses 1 to 6, wherein the object table comprises a temperature sensor configured to output a temperature signal and the heat load controller is configured to control the generated heat load at least partly based on the temperature signal.

11. The e-beam inspection tool according to clause 10, wherein the temperature signal is representative of a temperature of the object table.

12. The e-beam inspection tool according to any of the preceding clauses, wherein the heat load controller controlling the generated heat load is at least partly based on a trajectory and/or an actuation profile of the positioning device.

13. The e-beam inspection tool according to any of the preceding clauses, wherein the heat load controller comprises a thermal model configured to determine a temperature of the object table and/or the actuator at least partly based on the actuator heat load and/or the temperature signal, and the heat load controller is configured to control the generated heat load at least partly based on the determined temperature by the thermal model.

14. The e-beam inspection tool according to clause 13, wherein the thermal model is calibrated and/or updated at least partly based on the temperature signal.

15. The e-beam inspection tool according any of the preceding clauses, wherein the heat load controller is configured to control the generated heat load so as to obtain a predetermined temperature of the object table.

16. The e-beam inspection tool according clause 15, wherein the predetermined temperature of the object table is based on the actuator heat load.

17. The e-beam inspection tool according to any of the preceding clauses, wherein the e-beam inspection tool further comprises a heatsink.

18. The e-beam inspection tool according to clause 17, wherein the heatsink is configured to be kept at a substantially constant temperature.

19. The e-beam inspection tool according to any of the preceding clauses, wherein the generated heat load is applied during a start-up of the apparatus in order to bring the object table to a thermal equilibrium.

20. The e-beam inspection tool according to any of the preceding clauses, wherein the first positioner comprises a plurality of actuators.

21. The e-beam inspection tool according to clause 20, wherein at least one of the plurality of actuators is a contactless actuator.

22. The e-beam inspection tool according to clause 20 or 21, wherein the plurality of actuators comprises a first subset of actuators configured to exert a force in a substantially vertical direction on the object table and a second subset of actuators configured to exert a force in a substantially horizontal direction on the object table.

23. The e-beam inspection tool according to clause 20 to 22, wherein the heating device comprises a plurality of heating devices, at least one of the plurality of actuators comprising a heating device of the plurality of heating devices.

24. The e-beam inspection tool according to clause 23, wherein the heating device of the plurality of heating devices is at least partly mounted between a magnet assembly of the at least one of actuator of the plurality of actuators and the object table.

25. The e-beam inspection tool according to any of the preceding clauses, wherein the at least one of the actuators comprises a magnetic shielding.

26. The e-beam inspection tool according to any of the clauses 20 to 25, wherein the heat load controller is configured to control a heat load distribution of the plurality of heating devices such that a combined heat load of the at least one of the plurality of actuators and the associated heating device remains substantially constant during an operating cycle of the e-beam inspection tool.

27. The e-beam inspection tool according to any of the preceding clauses, wherein the heating device is an electric heating device.

28. The e-beam inspection tool according to clause 27, wherein the electric heating device is an inductive heating device.

29. The e-beam inspection tool according to clause 27, wherein the electric heating device comprises an electric heating wire mounted to the object table.

30. The e-beam inspection tool according to any of the preceding clauses, wherein the electron optics system comprises:
    an electron beam source configured to generate the electron beam;
    an imaging system configured to direct the electron beam onto a target area of the specimen to be inspected;
    a radiation detector configured to detect radiation emitted from the target area in response to the electron beam 31. The e-beam inspection tool according to any of the preceding clauses, wherein the e-beam inspection tool further comprises an electromagnetic shield comprising an absorptive coating.

32. A method of controlling heat load, the method comprising steps of:
    determining an actuator heat load of a positioning device;
    generating a heat load using a heating device arranged in the positioning device; and controlling the generated heat load at least partly based on the actuator heat load.

33. The method of controlling heat load according to clause 32, wherein the generated heat load is controlled such that a combined heat load of the generated heat load and the actuator heat load remains substantially constant during an operating cycle of the positioning device.

34. The method of controlling heat load according to clause 32 or 33, wherein the generated heat load is controlled at least partly based on a trajectory and/or an actuation profile of the positioning device.

35. The method of controlling heat load according to any of clause 32 to 34, wherein the generated heat load is applied during a start-up of the positioning device in order to bring an object table to be positioned by the positioning device to a thermal equilibrium.

36. An e-beam inspection tool comprising:
   a vacuum chamber;
   an electron optics system arranged inside said vacuum chamber and configured to generate an electron beam;
   an object table arranged inside said vacuum chamber and configured to hold a specimen;
   a positioning device arranged inside said vacuum chamber and configured to position the object table;
   wherein the vacuum chamber comprises an electromagnetic shield and wherein the electromagnetic shield comprises an absorptive coating.

37. The e-beam inspection tool according to clause 36, wherein the electromagnetic shield comprises mu-metal.

38. The e-beam inspection tool according to clause 36 or 37, wherein the absorptive coating is provided on a surface of the electromagnetic shield that faces the electron optics system, the object table or the positioning device.

39. The e-beam inspection tool according to any of clauses 36 to 38, wherein the absorptive coating comprises a material selected from the group comprising silicon nitride, titanium nitride and niobium nitride.

40. The e-beam inspection tool according to any of clauses 36 to 39, wherein the absorptive coating has a crystalline structure.

41. The e-beam inspection tool according to any of clauses 36 to 40, wherein the electromagnetic shield is arranged inside the vacuum chamber and attached to an inside surface of a wall of vacuum chamber.

42. The e-beam inspection tool according to clause 41, further comprising a clamp configured to press the electromagnetic shield against the wall of the vacuum chamber.

43. The e-beam inspection tool according to clause 42, wherein the clamp comprises a substantially rigid part and a compressible part that is arranged between the substantially rigid part and the electromagnetic shield.

44. The e-beam inspection tool according to clause 43, wherein the compressible part comprises a compressible material such as a synthetic rubber or an elastomer such as a fluoropolymer elastomer.

45. The e-beam inspection tool according to any of the clauses 42 to 44, wherein one or more clamps are arranged on a surface of the electromagnetic shield that faces the electron optics system, the object table or the positioning device.

46. An apparatus comprising:
   an object table configured to hold a specimen;
   a positioning device configured to position the object table, the positioning device comprising an actuator; and
   a vacuum chamber, the positioning device and the object table are arranged in the vacuum chamber,
   wherein the positioning device further comprises a heating device configured to generate a heat load and a heat load controller to control the generated heat load at least partly based on an actuator heat load generated in the actuator.

47. The apparatus according to clause 46, wherein the heating device is mounted to the object table.

48. The apparatus according to clause 46 or 47, wherein the positioning device comprises:
   a first positioner configured to position the object table; and
   a second positioner configured to position the first positioner and the object table.

49. The apparatus according to clause 48, wherein the actuator heat load comprises an actuator heat load by the first positioner.

50. The apparatus according to clause 48 or 49, wherein the first positioner is a short-stroke positioner and the second positioner is a long-stroke positioner.

51. The apparatus according to any of the preceding clauses, wherein the heat load controller is configured to control the generated heat load such that a combined heat load of the generated heat load and the actuator heat load remains substantially constant during an operating cycle of the apparatus.

52. The apparatus according to any of the preceding clauses, wherein the positioning device comprises a temperature sensor configured to output a temperature signal and the heat load controller is configured to control the generated heat load at least partly based on the temperature signal.

53. The apparatus according to clause 52, wherein the temperature signal is representative of a temperature of the positioning device.

54. The apparatus according to clause 52, wherein the temperature signal is representative of a temperature of the actuator.

55. The apparatus according to any of clause 46 to 51, wherein the object table comprises a temperature sensor configured to output a temperature signal and the heat load controller is configured to control the generated heat load at least partly based on the temperature signal.

56. The apparatus according to clause 55, wherein the temperature signal is representative of a temperature of the object table.

57. The apparatus according to any of the preceding clauses, wherein the heat load controller controlling the generated heat load is at least partly based on a trajectory and/or an actuation profile of the positioning device.

58. The apparatus according to any of the preceding clauses, wherein the heat load controller comprises a thermal model configured to determine a temperature of the object table and/or the actuator at least partly based on the actuator heat load and/or the temperature signal, and the heat load controller is configured to control the generated heat load at least partly based on the determined temperature by the thermal model.

59. The apparatus according to clause 58, wherein the thermal model is calibrated and/or updated at least partly based on the temperature signal.

60. The apparatus according any of the preceding clauses, wherein the heat load controller is configured to control the generated heat load so as to obtain a predetermined temperature of the object table.
61. The apparatus according clause 60, wherein the predetermined temperature of the object table is based on the actuator heat load.
62. The apparatus according to any of the preceding clauses, wherein the apparatus further comprises a heatsink.
63. The apparatus according to clause 62, wherein the heatsink is configured to be kept at a substantially constant temperature.
64. The apparatus according to any of the preceding clauses, wherein the generated heat load is applied during a start-up of the apparatus in order to bring the object table to a thermal equilibrium.
65. The apparatus according to any of the preceding clauses, wherein the first positioner comprises a plurality of actuators.
66. The apparatus according to clause 65, wherein at least one of the plurality of actuators is a contactless actuator.
67. The apparatus according to clause 65 or 66, wherein the plurality of actuators comprises a first subset of actuators configured to exert a force in a substantially vertical direction on the object table and a second subset of actuators configured to exert a force in a substantially horizontal direction on the object table.
68. The apparatus according to clause 65 to 67, wherein the heating device comprises a plurality of heating devices, at least one of the plurality of actuators comprising a heating device of the plurality of heating devices.
69. The apparatus according to clause 68, wherein the heating device of the plurality of heating devices is at least partly mounted between a magnet assembly of the at least one of actuator of the plurality of actuators and the object table.
70. The apparatus according to any of the preceding clauses, wherein the at least one of the actuators comprises a magnetic shielding.
71. The apparatus according to any of the clauses 65 to 70, wherein the heat load controller is configured to control a heat load distribution of the plurality of heating devices such that a combined heat load of the at least one of the plurality of actuators and the associated heating device remains substantially constant during an operating cycle of the apparatus.
72. The apparatus according to any of the preceding clauses, wherein the heating device is an electric heating device.
73. The apparatus according to clause 72, wherein the electric heating device is an inductive heating device.
74. The apparatus according to clause 72, wherein the electric heating device comprises an electric heating wire mounted to the object table.
75. The apparatus according to any of the preceding clauses, wherein the electron optics system comprises:
an electron beam source configured to generate the electron beam;
an imaging system configured to direct the electron beam onto a target area of the specimen to be inspected;
a radiation detector configured to detect radiation emitted from the target area in response to the electron beam
76. The apparatus according to any of the preceding clauses, wherein the apparatus further comprises an electromagnetic shield comprising an absorptive coating.
77. A method of controlling heat load, the method comprising steps of:
determining an actuator heat load of a positioning device;
generating a heat load using a heating device arranged in the positioning device; and
controlling the generated heat load at least partly based on the actuator heat load.
78. The method of controlling heat load according to clause 77, wherein the generated heat load is controlled such that a combined heat load of the generated heat load and the actuator heat load remains substantially constant during an operating cycle of the positioning device.
79. The method of controlling heat load according to clause 77 or 78, wherein the generated heat load is controlled at least partly based on a trajectory and/or an actuation profile of the positioning device.
80. The method of controlling heat load according to any of clauses 77 to 79, wherein the generated heat load is applied during a start-up of the positioning device in order to bring an object table to be positioned by the positioning device to a thermal equilibrium.
81. An apparatus comprising:
a vacuum chamber;
an object table arranged inside said vacuum chamber and configured to hold a specimen;
a positioning device arranged inside said vacuum chamber and configured to position the object table;
wherein the vacuum chamber comprises an electromagnetic shield and wherein the electromagnetic shield comprises an absorptive coating.
82. The apparatus according to clause 81, wherein the electromagnetic shield comprises mu-metal.
83. The apparatus according to clause 81 or 82, wherein the absorptive coating is provided on a surface of the electromagnetic shield that faces the object table or the positioning device.
84. The apparatus according to clause 81 or 82, further comprising an electron optics system, wherein the absorptive coating is provided on a surface of the electromagnetic shield that faces the electron optics system.
85. The apparatus according to any of clauses 81 to 84, wherein the absorptive coating comprises a material selected from the group comprising silicon nitride, titanium nitride and niobium nitride.
86. The apparatus according to any of clauses 81 to 85, wherein the absorptive coating has a crystalline structure.
87. The apparatus according to any of clauses 81 to 86, wherein the electromagnetic shield is arranged inside the vacuum chamber and attached to an inside surface of a wall of vacuum chamber.
88. The apparatus according to clause 87, further comprising a clamp configured to press the electromagnetic shield against the wall of the vacuum chamber.
89. The apparatus according to clause 88, wherein the clamp comprises a substantially rigid part and a compressible part that is arranged between the substantially rigid part and the electromagnetic shield.

90. The apparatus according to clause 89, wherein the compressible part comprises a compressible material such as a synthetic rubber or an elastomer such as a fluoropolymer elastomer.
91. The apparatus according to any of the clauses 88 to 90, wherein one or more clamps are arranged on a surface of the electromagnetic shield that faces the electron optics system, the object table or the positioning device.
92. The apparatus according to any of the clauses 46 to 76 or the clauses 81 to 91, wherein the apparatus is a SEM, an e-beam writer, an e-beam metrology tool, an e-beam lithography tool, an E-beam defect verification tool, a metrology tool, or a lithography apparatus.

Although the present disclosure has been explained in relation to its preferred embodiment, it is to be understood that other modifications and variations can be made without departing the spirit and scope of the disclosure as hereafter claimed.

Although the embodiments described in the specification are mainly related to an e-beam inspection tool or apparatus, the applications of this disclosure may not be limited to these particular embodiments. As e-beam tools or apparatus typically operate within a vacuum chamber, those e-beam tools or apparatus with the vacuum chamber share the same problem of thermal conditioning that it is difficult to remove generated heat loads in the vacuum chamber by heat conduction and heat convection. This is also the case for any tools or apparatus with a vacuum chamber. When there is a need to increase the throughput of these e-beam tools, the heat loads generated in the tools become higher, for example the heat generated in the actuator. Thus, the problem of the thermal conditioning becomes even more severe in these e-beam tools. Thus, the disclosure may be applied not only to the e-beam inspection tools but to any other kinds of e-beam tools such as CD-SEM, EBDW (E-Beam Direct Writer), EPL (E-beam Projection Lithography), and E-beam defect verification tool, and any kinds of tools with a vacuum chamber.

What is claimed is:

1. An e-beam inspection tool comprising:
   an electron optics system configured to generate an electron beam;
   an object table configured to hold a specimen; and
   a positioning device configured to position the object table, the positioning device comprising an actuator,
   wherein the positioning device further comprises a heating device configured to generate a heat load and a heat load controller to control the heat load generated at least partly based on an actuator heat load generated in the actuator, and
   wherein the heating device is mounted to the object table.
2. The e-beam inspection tool according to claim 1, wherein the positioning device comprises:
   a first positioner configured to position the object table; and
   a second positioner configured to position the first positioner and the object table.
3. The e-beam inspection tool according to claim 2, wherein the actuator heat load comprises an actuator heat load by the first positioner.
4. The e-beam inspection tool according to claim 2, wherein the first positioner comprises a plurality of actuators and the heating device comprises a plurality of heating devices, at least one of the plurality of actuators comprising a heating device of the plurality of heating devices.
5. The e-beam inspection tool according to claim 4, wherein the heat load controller is configured to control a heat load distribution of the plurality of heating devices such that a combined heat load of the at least one of the plurality of actuators and the heating device associated remains substantially constant during an operating cycle of the e-beam inspection tool.
6. The e-beam inspection tool according to claim 1, wherein the positioning device comprises a temperature sensor configured to output a temperature signal and the heat load controller is configured to control the heat load generated at least partly based on the temperature signal.
7. The e-beam inspection tool according to claim 6, wherein the heat load controller is configured to control the heat load generated so as to obtain a predetermined temperature of the object table.
8. The e-beam inspection tool according to claim 6, wherein the e-beam inspection tool further comprises a heatsink and the heatsink is configured to be kept at a substantially constant temperature.
9. A method of controlling heat load, the method comprising:
   determining an actuator heat load of a positioning device;
   generating a heat load using a heating device arranged in the positioning device, the heating device is mounted to an object table; and
   controlling the heat load generated at least partly based on the actuator heat load.
10. The method of controlling heat load according to claim 9, wherein the heat load generated is controlled such that a combined heat load of the heat load generated and the actuator heat load remains substantially constant during an operating cycle of the positioning device.
11. The method of controlling heat load according to claim 9, wherein the heat load generated is controlled at least partly based on a trajectory and/or an actuation profile of the positioning device.
12. The method of controlling heat load according to claim 9, wherein the heat load generated is applied during a start-up of the positioning device in order to bring an object table to be positioned by the positioning device to a thermal equilibrium.
13. An apparatus comprising:
   an object table configured to hold a specimen; and
   a positioning device configured to position the object table, the positioning device comprising an actuator,
   a vacuum chamber, the positioning device, and the object table are arranged in the vacuum chamber,
   wherein the positioning device further comprises a heating device configured to generate a heat load and a heat load controller to control the heat load generated at least partly based on an actuator heat load generated in the actuator, and
   wherein the heating device is mounted to the object table.
14. The apparatus according to claim 13, wherein the positioning device comprises:
   a first positioner configured to position the object table; and
   a second positioner configured to position the first positioner and the object table.
15. The apparatus according to claim 14, wherein the actuator heat load comprises an actuator heat load by the first positioner.
16. The apparatus according to claim 14, wherein the first positioner comprises a plurality of actuators and the heating device comprises a plurality of heating devices, at least one of the plurality of actuators comprising a heating device of the plurality of heating devices.

17. The apparatus according to claim 16, wherein the heat load controller is configured to control a heat load distribution of the plurality of heating devices such that a combined heat load of the at least one of the plurality of actuators and the hating device associated remains substantially constant during an operating cycle of the apparatus.

18. The apparatus according to claim 13, wherein the positioning device comprises a temperature sensor configured to output a temperature signal and the heat load controller is configured to control the heat load generated at least partly based on the temperature signal.

19. The apparatus according to claim 18, wherein the heat load controller is configured to control the heat load generated so as to obtain a predetermined temperature of the object table.

20. The apparatus according to claim 18, wherein the apparatus further comprises a heatsink configured to be kept at a substantially constant temperature.

\* \* \* \* \*